(12) United States Patent
Oh et al.

(10) Patent No.: US 9,570,370 B2
(45) Date of Patent: Feb. 14, 2017

(54) MULTI CHIP PACKAGE AND METHOD FOR MANUFACTURING THE SAME

(71) Applicant: SK HYNIX INC., Icheon (KR)

(72) Inventors: Tac Keun Oh, Seoul (KR); Jong Hoon Kim, Suwon (KR); Ho Young Son, Cheongwon (KR); Jeong Hwan Lee, Seoul (KR)

(73) Assignee: SK HYNIX INC., Icheon (KR)

( * ) Notice: Subject to any disclaimer, the term of this patent is extended or adjusted under 35 U.S.C. 154(b) by 38 days.

(21) Appl. No.: 14/460,734

(22) Filed: Aug. 15, 2014

(65) Prior Publication Data

US 2015/0340303 A1 Nov. 26, 2015

(30) Foreign Application Priority Data

May 22, 2014 (KR) .................... 10-2014-0061663

(51) Int. Cl.
| | |
|---|---|
| *H01L 23/36* | (2006.01) |
| *H01L 21/48* | (2006.01) |
| *H01L 23/498* | (2006.01) |
| *H01L 25/065* | (2006.01) |
| *H01L 23/34* | (2006.01) |
| *H01L 21/56* | (2006.01) |
| *H01L 23/538* | (2006.01) |
| *H01L 23/31* | (2006.01) |
| *H01L 23/42* | (2006.01) |

(52) U.S. Cl.
CPC ............ *H01L 23/36* (2013.01); *H01L 21/486* (2013.01); *H01L 21/4871* (2013.01); *H01L 21/56* (2013.01); *H01L 23/34* (2013.01); *H01L 23/49827* (2013.01); *H01L 23/5384* (2013.01); *H01L 23/5385* (2013.01); *H01L 25/0657* (2013.01); *H01L 23/3128* (2013.01); *H01L 23/42* (2013.01); *H01L 2224/16225* (2013.01); *H01L 2224/32225* (2013.01); *H01L 2224/73204* (2013.01); *H01L 2924/15311* (2013.01); *H01L 2924/181* (2013.01); *H01L 2924/18161* (2013.01)

(58) Field of Classification Search
CPC ............ H01L 2224/13016; H01L 2224/29553; H01L 2224/29551; H01L 2224/2955; H01L 2224/29019; H01L 2224/16056; H01L 2224/13553
USPC ........................................ 257/686, 685, 739
See application file for complete search history.

(56) References Cited

U.S. PATENT DOCUMENTS

| | | | |
|---|---|---|---|
| 8,105,875 B1* | 1/2012 | Hu ...................... | H01L 21/486 257/E21.499 |
| 8,779,578 B2* | 7/2014 | Leigh et al. .................. | 257/706 |
| 2002/0167079 A1* | 11/2002 | Pu et al. ....................... | 257/685 |

(Continued)

FOREIGN PATENT DOCUMENTS

| | | |
|---|---|---|
| KR | 10-2006-0119769 A | 11/2006 |
| KR | 10-2013-0076748 A | 7/2013 |

*Primary Examiner* — Matthew Landau
*Assistant Examiner* — Krista Soderholm

(57) ABSTRACT

A multi chip package includes a protective layer having an upper surface that surrounds a first chip and a second chip, which are mounted over a first substrate, to expose an upper surface of the first chip and an upper surface of the second chip, a heat spreader disposed over the upper surfaces, and a thermal interface material disposed at an interface between the heat spreader and the upper surfaces.

5 Claims, 13 Drawing Sheets

(56) References Cited

U.S. PATENT DOCUMENTS

| | | | |
|---|---|---|---|
| 2008/0308926 A1* | 12/2008 | Hung | H01L 21/565 257/706 |
| 2009/0108429 A1* | 4/2009 | Tsao et al. | 257/686 |
| 2010/0224983 A1* | 9/2010 | Huang | H01L 21/568 257/692 |
| 2011/0037157 A1* | 2/2011 | Shin | H01L 23/49827 257/686 |
| 2013/0063843 A1* | 3/2013 | Chen | H01L 23/552 361/56 |
| 2014/0252632 A1* | 9/2014 | Barth et al. | 257/773 |

* cited by examiner

MULTI CHIP PACKAGE AND METHOD FOR MANUFACTURING THE SAME

CROSS-REFERENCES TO RELATED APPLICATIONS

The present application claims priority under 35 U.S.C 119(a) to Korean Application No. 10-2014-0061663, filed on May 22, 2014, in the Korean Intellectual Property Office, which is hereby incorporated by reference in its entirety.

BACKGROUND

Embodiments of the present disclosure relate to a package technology, and more particularly, to a multi chip package including a heat spreader, and a method for manufacturing the same.

A semiconductor device may include various electronic circuit elements and may be used to construct electronic appliances. Various electronic devices, such as a computer, a mobile appliance, or a data storage device, may utilize a memory semiconductor chip or a chip package.

In order to realize electronic products, such as smart phones, that are lightweight and small in size, a package of the semiconductor device within the electronic product should likewise be small in size. Multi chip package technology of collecting semiconductor chips having different functions into one package, which realizes high capacity and multi-functional operations within a single package product, provides such a desired form factor. For example, System In Package (SIP) technology enables the arrangement of a plurality of chips having different functions on a substrate, which efficiently packages the chips into a package that is small in size. However, the plurality of semiconductor chips performs high speed operations in a small area, which requires an efficient spreading of heat.

SUMMARY

In an embodiment, a multi chip package includes: a first chip and a second chip mounted on a first substrate in parallel to each other; a protective layer having an upper third surface that surrounds the first chip and the second chip to expose an upper first surface of the first chip and an upper second surface of the second chip, and links the first surface to the second surface; a heat spreader positioned on the first to third surfaces; and a thermal interface material positioned on the heat spreader and an interface of the first to third surfaces.

In another embodiment, a multi chip package includes: a first chip and a second chip mounted on a package substrate in parallel to each other; a protective layer having an upper third surface that surrounds the first chip and the second chip to expose an upper first surface of the first chip and an upper second surface of the second chip, and links the first surface to the second surface; a heat spreader positioned on the first to third surfaces; a thermal interface material positioned on the heat spreader and an interface of the first to third surfaces; and a stiffener upright on the substrate to support the heat spreader.

In another embodiment, a method for manufacturing a multi chip package includes: mounting a first chip and a second chip on a first substrate in parallel to each other; forming a protective layer that covers the first chip and the second chip; removing a part of an upper side of the protective layer and a part of upper sides of the first chip and the second chip to expose an upper first surface of the first chip, an upper second surface of the second chip, and an upper third surface of the protective layer that links the first and second surfaces to each other; and introducing a thermal interface material on the first to third surfaces and attaching a heat spreader.

In another embodiment, a memory card includes a multi chip package, the multi chip package includes a first chip mounted over an upper surface of a first substrate; a second chip mounted over the upper surface of the first substrate; a protective layer disposed to surround the first chip and the second chip, the protective layer exposing an upper surface of the first chip and an upper surface of the second chip; a thermal interface material disposed over the upper surface of the first chip, the upper surface of the second chip, and an upper surface of the protective layer; and a heat spreader disposed over the thermal interface material.

In another embodiment, an electronic system includes a multi chip package, the multi chip package includes a first chip mounted over an upper surface of a first substrate; a second chip mounted over the upper surface of the first substrate; a protective layer disposed to surround the first chip and the second chip, the protective layer exposing an upper surface of the first chip and an upper surface of the second chip; a thermal interface material disposed over the upper surface of the first chip, the upper surface of the second chip, and an upper surface of the protective layer; and a heat spreader disposed over the thermal interface material.

In another embodiment, a memory card includes a multi chip package, the multi chip package includes a first chip mounted over an upper surface of a package substrate; a second chip mounted over the upper surface of the package substrate; a protective layer disposed to surround the first chip and the second chip, the protective layer exposing an upper surface of the first chip and an upper surface of the second chip; a thermal interface material disposed over the upper surface of the first chip, the upper surface of the second chip, and an upper surface of the protective layer; a heat spreader disposed over the thermal interface material; and a vertical stiffener disposed over the substrate to support the heat spreader.

In another embodiment, an electronic system includes a multi chip package, the multi chip package includes a first chip mounted over an upper surface of a package substrate; a second chip mounted over the upper surface of the package substrate; a protective layer disposed to surround the first chip and the second chip, the protective layer exposing an upper surface of the first chip and an upper surface of the second chip; a thermal interface material disposed over the upper surface of the first chip, the upper surface of the second chip, and an upper surface of the protective layer; a heat spreader disposed on the thermal interface material; and a vertical stiffener disposed over the substrate to support the heat spreader.

BRIEF DESCRIPTION OF THE DRAWINGS

Embodiments of the inventive concept will become more apparent in view of the attached drawings and accompanying detailed description, in which.

DETAILED DESCRIPTION

In the present specification, terms such as "first" and "second" are used to distinguish members from each other, and do not limit the members or indicate a specific order. Furthermore, when a member is referred to as being "on" another member or being at the "top" or "bottom" of or "inside" another member, it indicates the relative positional relation therebetween, and does not specify the case in which the member is directly contacted with the another member or another member is further interposed at the interface therebetween. Furthermore, when an element is referred to as being "coupled" or "connected" to another element, it indicates that the element is directly coupled or connected to the another element, and an additional layer may be interposed therebetween. When two elements are "directly coupled" or "directly connected" to each other, it may indicate that no element is interposed therebetween. Such an indication may also be applied to other expressions for describing the relation between elements. A semiconductor chip may indicate a chip obtained by dicing a semiconductor substrate having electronic circuits integrated therein in the form of a chip. A semiconductor substrate or semiconductor chip may be a memory chip such as DRAM, SRAM, FLASH, MRAM, ReRAM, FeRAM, or PcRAM or a logic chip having a logic circuit integrated therein.

Figure 1:
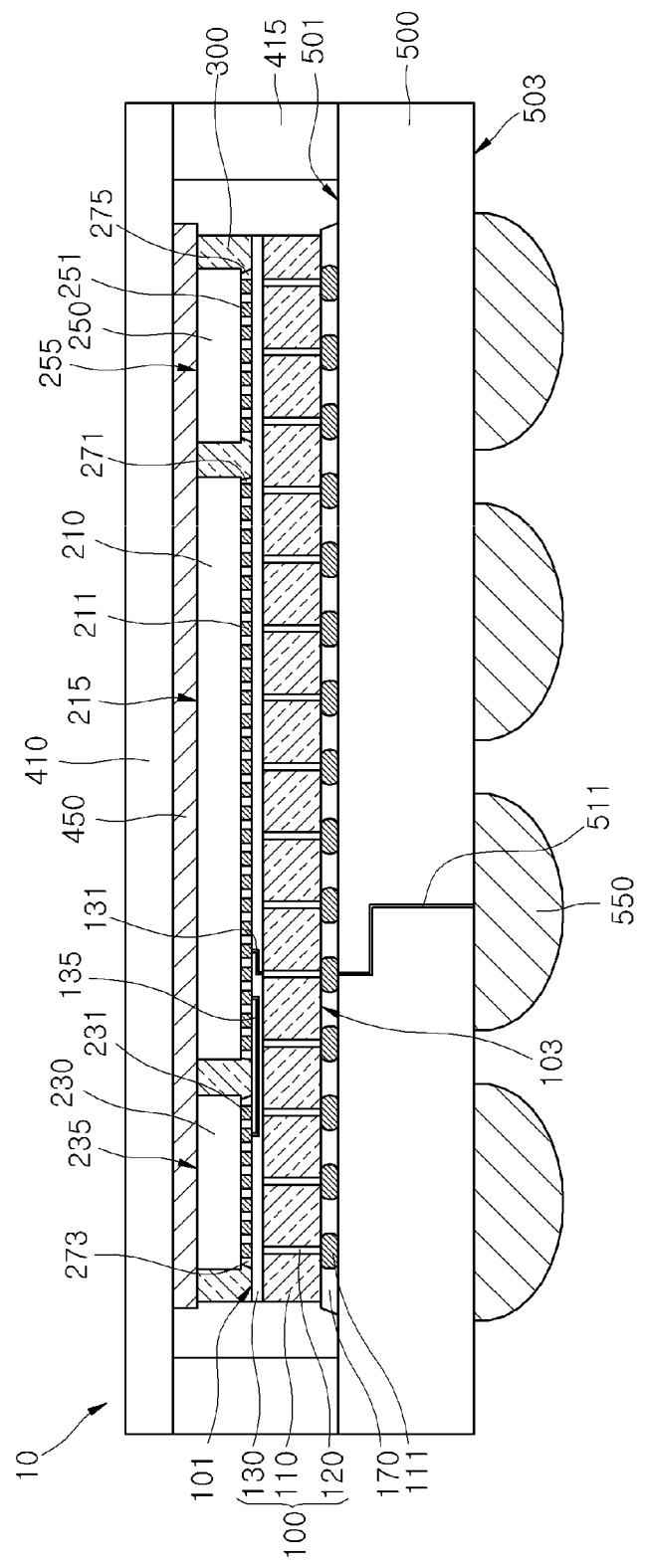
FIG. 1 is a sectional view illustrating a multi chip package according to an embodiment.
Figure 2:
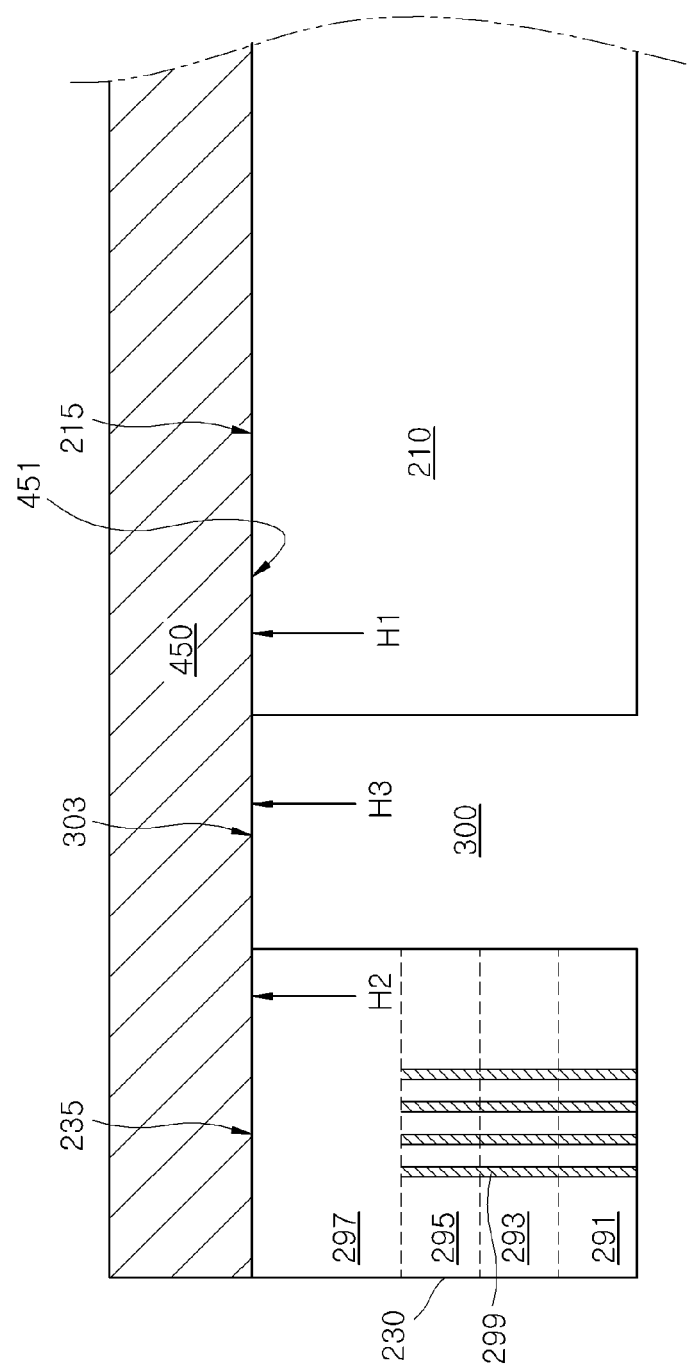
FIGS. 2 and 3 are diagrams illustrating an attachment state of a thermal interface material.
Figure 3:
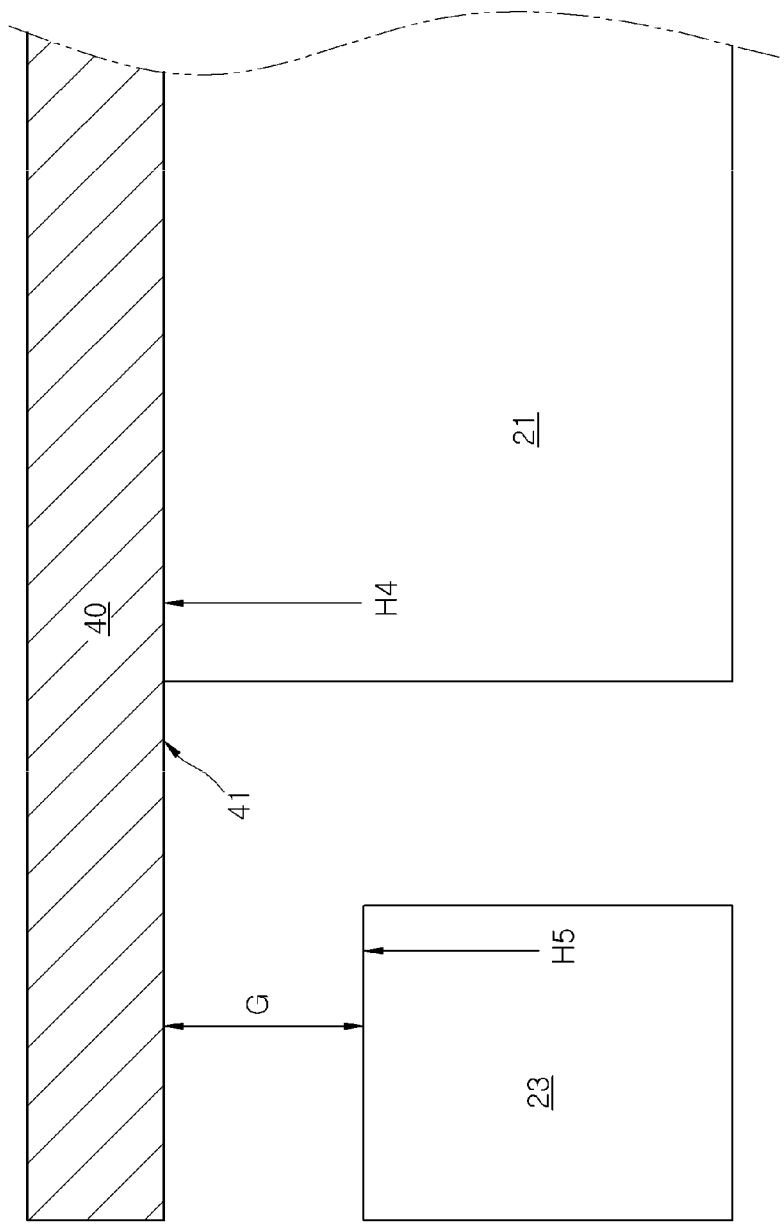

FIG. 1 is a sectional view illustrating a multi chip package according to an embodiment. FIGS. 2 and 3 are diagrams depicting an attachment state of a thermal interface material.

Referring to FIG. 1, a multi chip package 10 may include a plurality of semiconductor chips 210, 230, and 250 mounted on an upper surface 101 of a first package substrate 100. The first package substrate 100 may have an interposer structure. For example, the interposer structure may include a first silicon substrate body 110 and first through electrodes 120, which pass through the first substrate body 110 to electrically connect layers or elements, e.g., provide a vertical electrical connection. The first through electrode 120 may be provided by through-silicon via (TSV) technology.

On a bottom surface 103 opposite to the upper surface 101 of the first package substrate 100, first connection parts 111, such as bumps, are coupled with one end of the first through electrodes 120. The other end of the first through electrodes 120 may be substantially electrically connected or coupled to the semiconductor chips 210, 230, and 250.

A part or some of the first through electrodes 120 may be connected to a second connection part 211, which provides an external electrical connection to the first semiconductor chip 210 via a first interconnection part 131. Furthermore, a part or some of the first through electrodes 120 may be connected to a third connection part 231, which provides an external electrical connection to the second semiconductor chip 230 and a part or some of the first through electrodes 120 may be connected to a fourth connection part 251 which provides an external electrical connection to the third semiconductor chip 250. The first through electrodes 120 provide a vertical connection structure for electrically connecting the semiconductor chips 210, 230, and 250 to the first connection parts 111.

A dielectric layer 130 is disposed on the first substrate body 110 of the interposer. The first dielectric layer 130 may include an insulation material or a dielectric material layer, such as silicon oxide, nitride, or insulating polymer. The first dielectric layer 130 may insulate the first interconnection part 131, which may have a circuit interconnection structure.

In order to electrically connect the semiconductor chips 210, 230, and 250 to one another, the first package substrate 100 may include a second interconnection part 135 having a horizontal connection structure. The second interconnection part 135 may have a connection structure that connects two adjacent semiconductor chips, such the first chip 210 and the second chip 230. The second interconnection part 135 may have a multilayer circuit interconnection structure disposed within the first dielectric layer 130 or within the first substrate body 110. For example, the first package substrate 100 may be an interposer having TSV, and may constitute a 2.5D SIP structure.

The first package substrate 100 may be mounted on a second package substrate 500, which may be prepared in the form of a printed circuit board (PCB). The first substrate 100 may be mounted on an upper surface 501 of the second package substrate 500. A bottom surface 503 may include or contact connection parts 550, such as solder balls, in order to make an external connection. An interconnection part 511 for electrically connecting the first connection parts 111 of the first substrate 100 to the connection part 550 may be disposed in the second substrate 500.

A second dielectric layer 170 may be provided between the first package substrate 100 and the second package substrate 500, in order to isolate the first connection parts 111 from one another. A third dielectric layer 271 may be provided between the first package substrate 100 and the first semiconductor chip 210, in order to isolate the second connection parts 211 from one another. A fourth dielectric layer 273 may be provided between the first package substrate 100 and the second semiconductor chip 230, in order to isolate the third connection parts 231 from one another. A fifth dielectric layer 275 may be provided between the first package substrate 100 and the third semiconductor chip 250, in order to isolate the fourth connection parts 251 from one another. In an embodiment, the second dielectric layer 170, the third dielectric layer 271, the fourth dielectric layer 273, and the fifth dielectric layer 275 may include an underfill.

Referring to FIG. 1 and FIG. 2, a protective layer 300 is disposed to surround the first chip 210, the second chip 230, and the third chip 250, and to expose upper surfaces of the chips. The protective layer 300 may laterally surround and fix the semiconductor first chip 210, the semiconductor second chip 230, and/or the semiconductor third chip 250, filling some or all gaps between the chips. The protective layer 300 may be a layer including a dielectric material. The dielectric material may include a molding member, such as epoxy molding compound (EMC). The protective layer 300 may have an upper surface 303, which exposes an upper surface 215 of the first semiconductor chip 210 and an upper surface 235 of the second semiconductor chip 230. The upper surface 303 of the protective layer 300 may be formed to expose an upper surface 255 of the third semiconductor chip 250.

As illustrated in FIG. 2, the upper surface 303 of the protective layer 300 may act as an intermediate surface that forms a continuous surface between the upper surface 215 of the first chip 210 and the upper surface 235 of the second chip. In an embodiment, the upper surface 215 of the first chip 210 may be a smooth or flat surface, the upper surface 235 of the second chip 230 may be a smooth or flat surface, and the upper surface 303 of the protective layer 300 may also be a smooth or flat surface. For example, an entire surface, which may include the upper surface 215 of the first chip 210, the upper surface 235 of the second chip 230, and the upper surface 303 of the protective layer 300 is a smooth surface when the entire surface is without a stepped portion (e.g., a portion having a rapidly changing height) or a concave portion.

Thus, in an embodiment, the upper surface 215 of the first chip 210, the upper surface 235 of the second chip 230, and the upper surface 303 of the protective layer 300 form a global planar surface. For example, a surface height H1 of the upper surface 215 of the first chip 210, a surface height H2 of the upper surface 235 of the second chip 230, and a surface height H3 of the upper surface 303 of the protection layer 300, as measured from the upper surface 101 of the first substrate 100, may be level or equal with one another. In an embodiment, he upper surface 255 of the third chip 250 may also have substantially the same height level.

A thermal interface material 450 may be coated, attached, or otherwise disposed to the upper surfaces 215, 235, 255, and 303 of the semiconductor chips 210, 230, and 250 and the protective layer 300. When the upper surfaces 215, 235, 255, and 303 of the semiconductor chips 210, 230, and 250 and the protective layer 300 form a global planar surface that is substantially planar, a contact surface 451 of the thermal interface material 450 may make close contact with the upper surfaces 215, 235, 255, and 303, preventing or limiting formation of a void or a delaminated gap at the contact interface.

Referring to FIG. 1 and FIG. 2, the first semiconductor chip 210 and the second semiconductor chip 230 may be similarly sized, and/or may perform different functions. The third semiconductor chip 250 may also have a size that is similar to the size of the first semiconductor chip 210, and/or may perform functions different from the functions performed by the first semiconductor chip 210. For example, the first semiconductor chip 210 may be a logic chip, such as a graphic processing unit (GPU), a central processing unit (CPU), or a system on chip (SoC). The second semiconductor chip 230 or the third semiconductor chip 250 may be a memory chip (or a memory device), such as a DRAM device.

For example, as shown in FIG. 2, the second semiconductor chip 230 may be a chip in which a plurality of vertically stacked semiconductor dies 291, 293, 295, and 297 (or, semiconductor substrates or semiconductor chips) integrated with DRAM devices are disposed. The stacked first, second, third, and fourth semiconductor dies 291, 293, 295, and 297 may have through electrodes 299, such as TSV that substantially passes through a die body, and may be electrically connected to one another via a common or shared vertical connection structure. The second semiconductor chip 230 (or, the third chip 250) may have a stack structure in which the plurality of semiconductor dies 291, 293, 295, and 297 employ TSV, and may be a part of high bandwidth memory (HBM).

FIG. 3 depicts a configuration where different types of semiconductor chips 21, 23 are provided in one package. The chips 21, 23 may have different or varying heights (e.g., a height H4 of a fourth semiconductor chip 21 is different from a height H5 of a fifth semiconductor chip 23), and a delaminated gap G may occur between the chips, because a contact surface 41 of a thermal interface material 40 may contact the fourth chip 21, but may not contact the fifth chip 23. When a gap G occurs, heat generated in the fifth chip 23 is not easily transferred to the thermal interface material 40 (e.g., the heat is locally trapped in the package), which may result in an abnormal operation of the semiconductor device.

However, as illustrated in FIG. 2, when the contact surface 451 of the thermal interface material 450 contacts the interface of the upper surfaces 215, 235, 255, and 303, heat generated in the semiconductor chips 210, 230, and 250 can be easily transferred to a heat spreader (e.g., heat spreader 410 of FIG. 1) attached to the thermal interface material 450 through the thermal interface material 450, and can be discharged outside the multi chip package 10. Therefore, the heat spreading efficiency of the multi chip package 10 may be increased or maximized, in order to effectively prevent characteristics and operation of a device from deteriorating due to heat, or to prevent a reduced operation efficiency and/or operation speed of the semiconductor chips 210, 230, and 250.

Referring back to FIG. 1, the heat spreader 410 is positioned, attached, or otherwise disposed on the semiconductor chips 210, 230, and 250, and the protective layer 300, through the thermal interface material 450. In an embodiment, a vertical or upright stiffener 415 may be positioned or disposed to support or mechanically reinforce a peripheral portion of the heat spreader 410. The stiffener 415 may be disposed in an upright position at the peripheral portion of the upper surface 501 of the second package substrate 500. Although not illustrated in the drawing, an adhesive may be interposed between the stiffener 415 and the heat spreader 410, or between the stiffener 415 and the upper surface 501 of the second substrate 500.

FIGS. 4 to 8 are diagrams illustrating a method for manufacturing the multi chip package, according to an embodiment.

Figure 4:
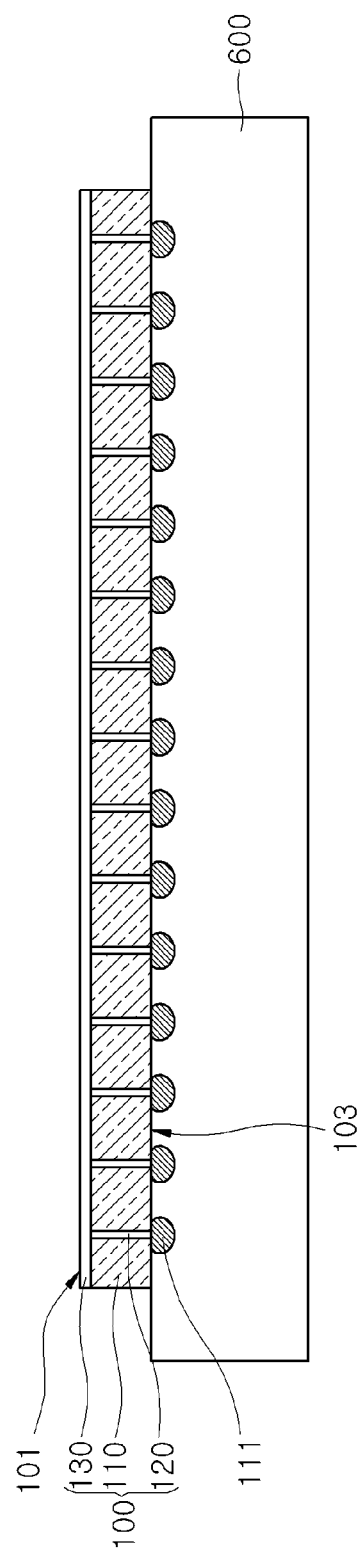
FIGS. 4 to 8 are diagrams illustrating a method for manufacturing a multi chip package according to an embodiment.

FIG. 4 illustrates a shape obtained by mounting the first package substrate 100 on a carrier 600. The first package substrate 100 is mounted on the carrier 600, such that the bottom surface 103 of the first package substrate 100, which includes the first connection parts 111, faces an upper surface of the carrier 600, and the upper surface 101 of the first package substrate 100 is exposed to an upper side. The carrier 600 may be a wafer-like or film-like member for supporting the first package substrate 100 during processing of a semiconductor package. The first package substrate 100 may be a PCB-like substrate, or may be have an interposer substrate structure, including the first silicon substrate body 110, the first through electrodes 120, which pass through the body 110, and the first dielectric layer 130.

Figure 5:
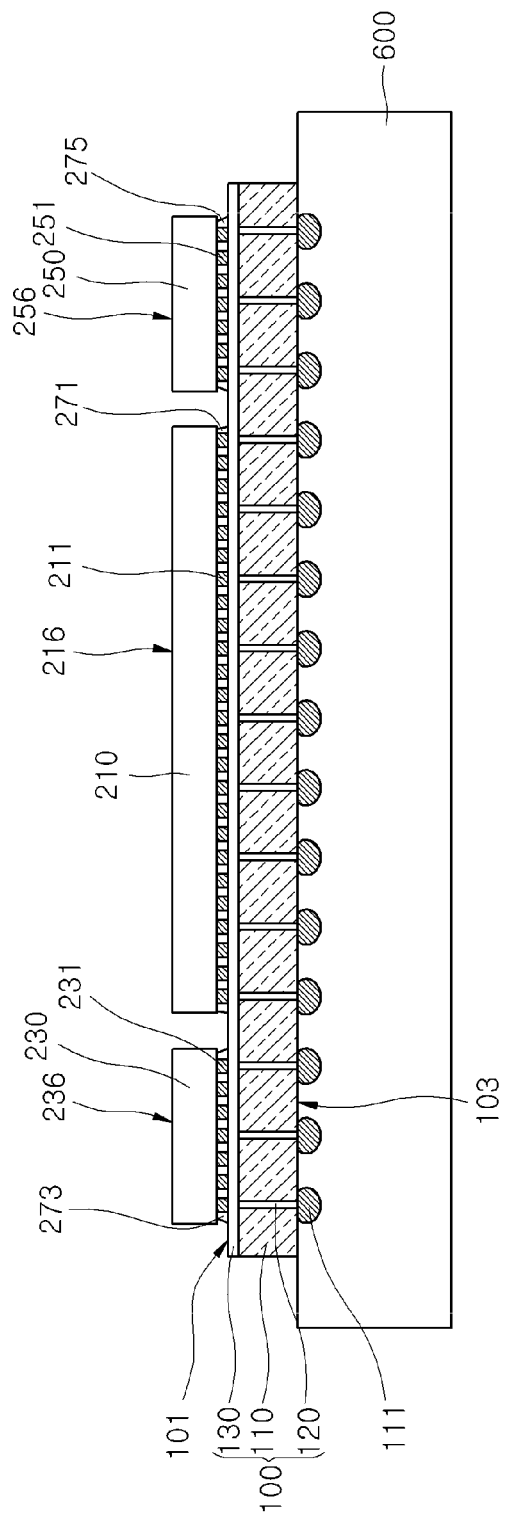

FIG. 5 illustrates a process of arranging, positioning, or disposing the first semiconductor chip 210, the second semiconductor chip 230, and the third semiconductor chip 250 on the upper surface 101 of the first package substrate 100. For example, the first semiconductor chip 210, the second semiconductor chip 230, and the third semiconductor chip 250 may be arranged in parallel to one another. The second connection parts 211 associated with the first semiconductor chip 210, the third connection parts 231 associated with the second semiconductor chip 230, and the fourth connection parts 251 associated with the third semiconductor chip 250, are mounted and electrically connected to the first through electrodes 120.

The third dielectric layer 271, such as an underfill, is formed between the first package substrate 100 and the first semiconductor chip 210, in order to isolate the second connection parts 211 from one another. The fourth dielectric layer 273, such as an underfill, is formed between the first package substrate 100 and the second semiconductor chip 230, in order to isolate the third connection parts 231 from one another. A fifth dielectric layer 275, such as an underfill, may be formed between the first package substrate 100 and the third semiconductor third chip 250, in order to isolate the fourth connection parts 251 from one another.

The first semiconductor chip 210 may be provided thereon with an initial upper surface 216, the second semiconductor chip 230 may be provided thereon with an initial upper surface 236, and the third semiconductor chip 250 may be provided thereon with an initial upper surface 256. The second semiconductor chip 230 and the third semiconductor chip 250 may be the same chip type. The first semiconductor chip 210 and the second semiconductor chip 230 or the third semiconductor chip 250 may be different chip types.

When the first semiconductor chip 210 has a thickness that is different from the thickness of the second semiconductor chip 230 or the third semiconductor chip 250, a surface height of the initial upper surface 216 may be different from a surface height of the initial upper surface 236 or from a surface height of the initial upper surface 256. Therefore, a surface height difference may occur between the semiconductor chips 210, 230, and 250. As described herein, such a surface height difference may cause a void or coating failure on an interface, which may reduce the heat spreading efficiency of the package. A global planarization process may be performed to remove the surface height differences between the chips 210, 230, and 250

Figure 6:
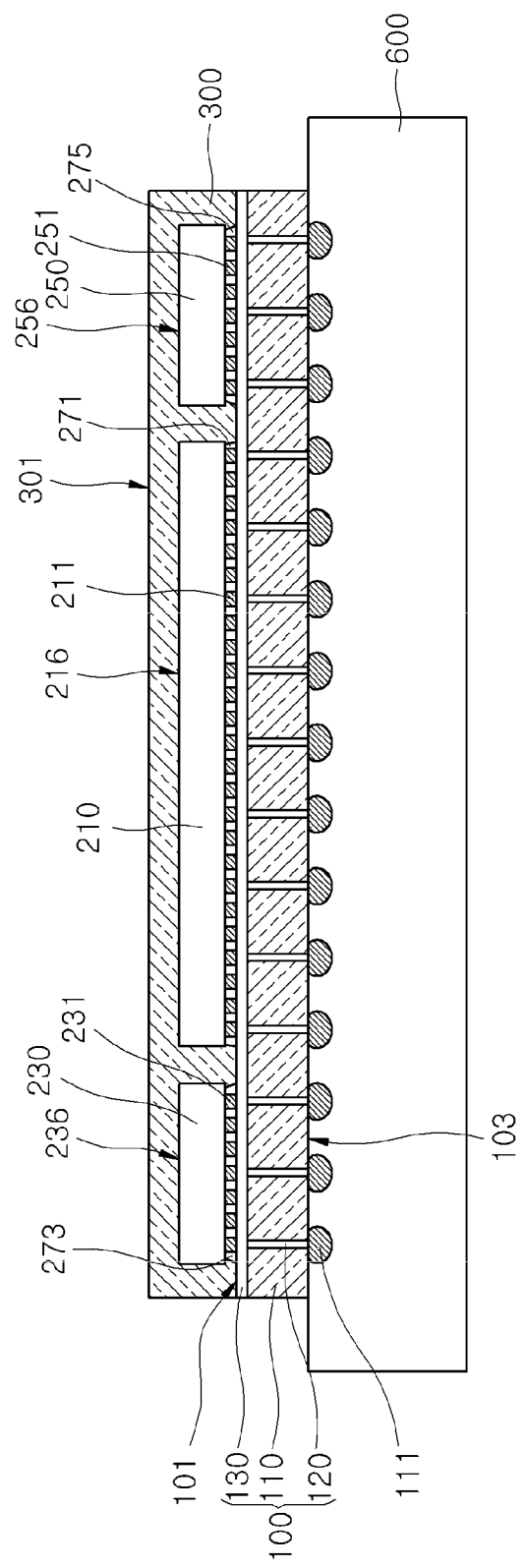

FIG. 6 illustrates a process of forming the protective layer 300, which covers the semiconductor chips 210, 230, and 250. An EMC molding process is formed on the first package substrate 100 to form the protective layer 300. In an embodiment, he EMC molding process may be performed through wafer level molding. In addition to the EMC molding process, a dielectric material is coated to form the protective layer 300, in order to cover the semiconductor chips 210, 230, and 250, and fill gaps between the semiconductor chips 210, 230, and 250. Thus, the protective layer 300 may be formed to cover the semiconductor chips 210, 230, and 250, thereby exposing an initial upper surface 301 of the protective layer 300 to an upper side of the package.

Figure 7:
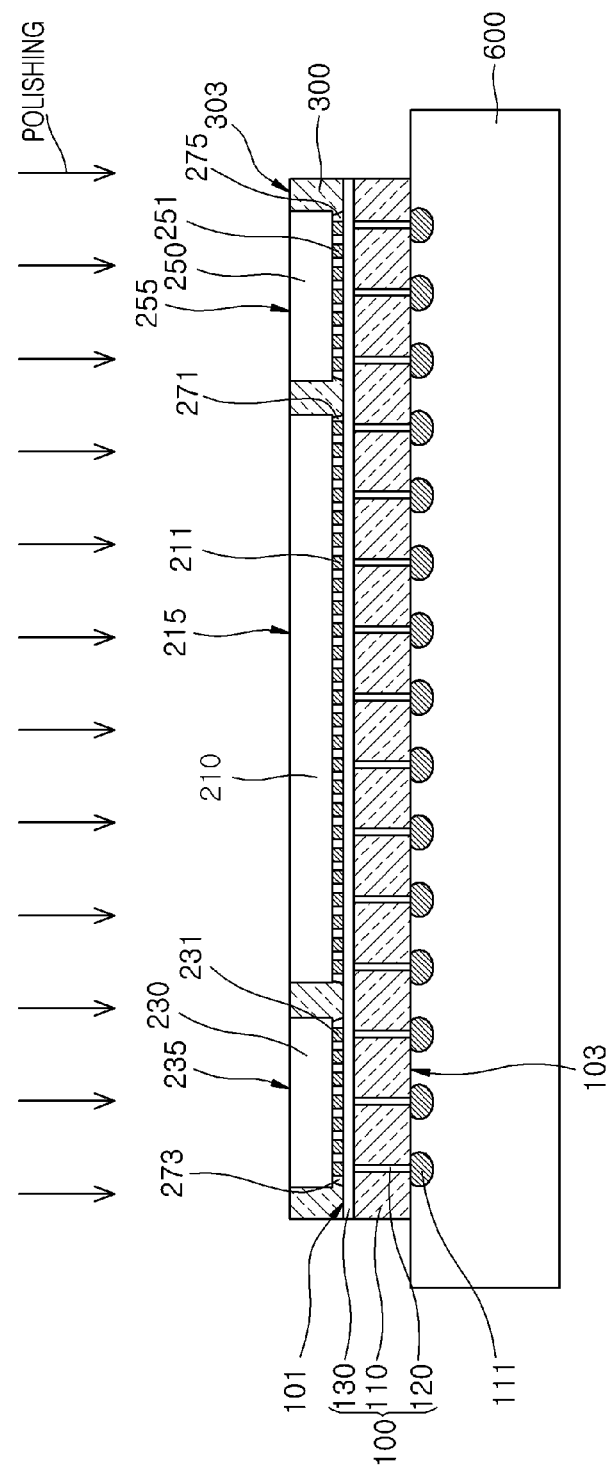
Figure 8:
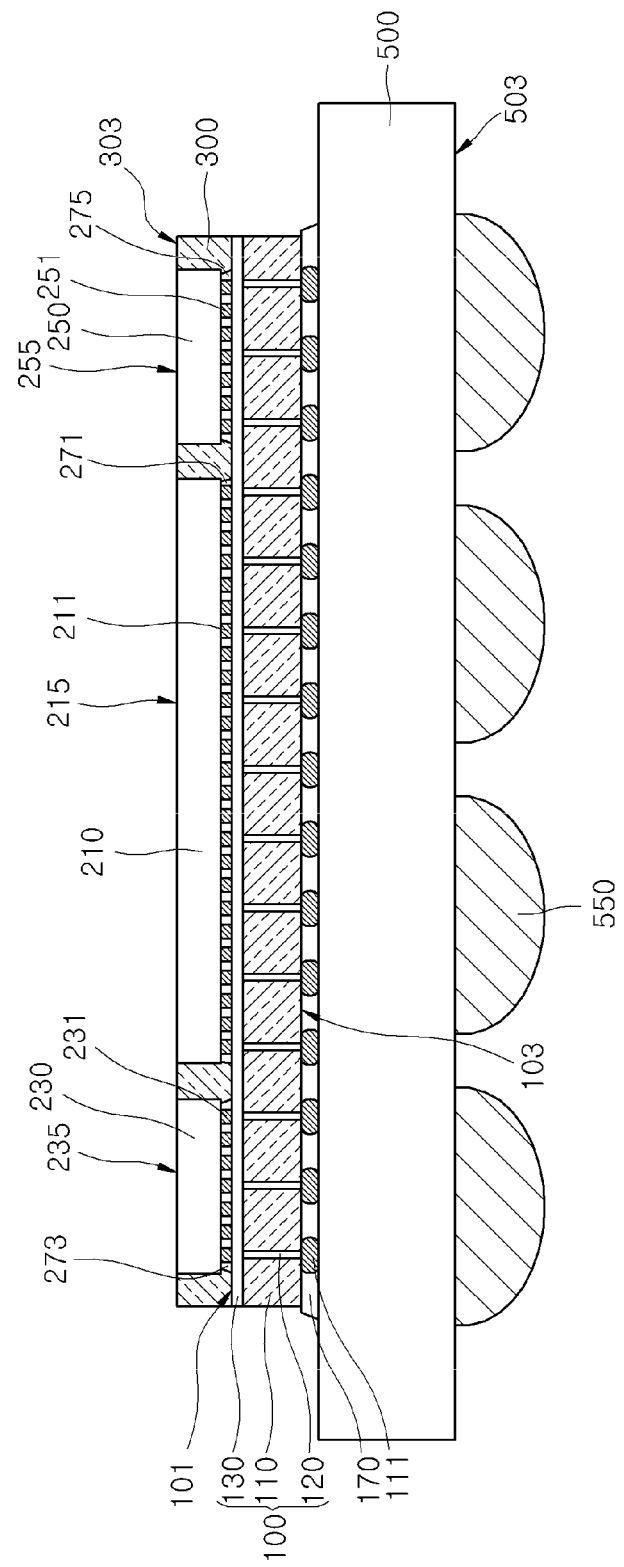

FIG. 7 illustrates a process of removing a part of an upper side of the protective layer 300 and a part of upper sides of the semiconductor chips 210, 230, and 250. A removal process is performed on the upper surface 301 of the protective layer 300 to remove the part of the upper side of the protective layer 300 and remove the part of the upper sides of the exposed semiconductor chips 210, 230, and 250, thereby exposing the upper surfaces 215, 235, and 255. The removal process may be performed as a global planarization process that is performed on an entire area where the protective layer 300 has been formed. For example, the removal process may be performed as a polishing process, such as chemical mechanical polishing (CMP). Alternatively, the removal process may be performed as an etch-back process. Before the CMP or the etch-back process, preliminary grinding may be performed. After the removal process, the polished upper surface 215 of the first semiconductor chip 210, the polished upper surface 235 of the second semiconductor chip 230, the polished upper surface 303 of the protective layer 300, and the polished upper surface 255 of the third semiconductor chip 250 are exposed, and these surfaces form the global planar surface 215, 235, 255, and 303, as described herein. FIG. 8 illustrates a process of mounting the first package substrate 100 on the second package substrate 500. After the planarization process of forming the global planar surface 215, 235, 255, and 303, the first package substrate 100 is mounted on the second package substrate 500. After the first package substrate 100 is separated from the carrier 600, singulation is performed to separate the first package substrate 100 in the form of a single component, and the first package substrate 100 is mounted on the second package substrate 500. The second dielectric layer 170 is formed between the first package substrate 100 and the second package substrate 500, in order to isolate the first connection parts 111 from one another. Then, as illustrated in FIG. 1, the thermal interface material 450 is coated on the global planar surface 215, 235, 255, and 303, and the heat spreader 410 is attached or otherwise disposed on the thermal interface material 450. Before attaching the heat spreader 410, the stiffener 415 is attached in an upright position at the peripheral portion of the second package substrate 500, in order to support the peripheral portion of the heat spreader 410.

Figure 9:
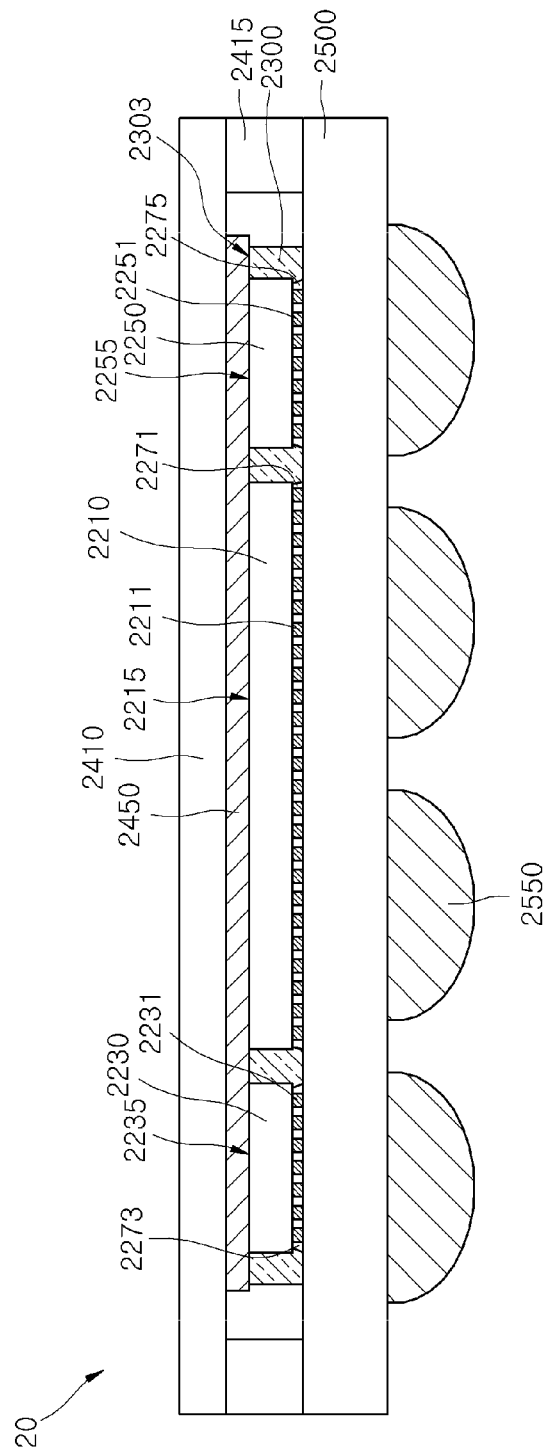
FIG. 9 is a sectional view illustrating a multi chip package according to another embodiment.

FIG. 9 is a sectional view illustrating a multi chip package according to another embodiment.

Referring to FIG. 9, in a multi chip package 20, a first semiconductor chip 2210, a second semiconductor chip 2230, and a third semiconductor chip 2250 may be directly mounted on a third package substrate 2500. The third package substrate 2500 may be provided with fifth connection parts 2550, (e.g., solder balls) on a lower surface, to facilitate an external electrical connection.

Second connection parts 2211 of the first semiconductor chip 2210, third connection parts 2231 of the second semiconductor chip 2230, and fourth connection parts 2251 of the third semiconductor chip 2250 are mounted on the third semiconductor chip 2250 to electrically connect to the fifth connection parts 2550. Such a structure may be obtained by removing any one of the first substrate (100 of FIG. 1), which may have an interposer type, and/or the second substrate (500 of FIG. 1), which may have a PCB type. The third package substrate 2500 may be provided to have substantially the same function as that of the first substrate (100 of FIG. 1) or the second substrate (500 of FIG. 1). For example, the third package substrate 2500 may be prepared in the form of an interposer or a PCB.

A third dielectric layer 2271 is provided between the third package substrate 2500 and the first semiconductor chip 2210, in order to isolate the second connection parts 2211 from one another. A fourth dielectric layer 2273 is provided between the third package substrate 2500 and the second semiconductor chip 2230, in order to isolate the third connection parts 2231 from one another. A fifth dielectric layer 2275 is provided between the third package substrate 2500 and the third semiconductor chip 2250, in order to isolate the fourth connection parts 2251 from one another.

An upper surface 2303 of a protective layer 2300, an upper surface 2215 of the first semiconductor chip 2210, an upper surface 2235 of the second semiconductor chip 2230, and an upper surface 2255 of the third semiconductor chip 2250 may form a global planar surface, as described herein. A thermal interface material 2450 is provided on the global planar surface 2215, 2235, 2255, and 2303, and a heat spreader 2410 is provided on the thermal interface material 2450. The heat spreader 2410 is supported by a stiffener 2415, which is disposed in an upright position at the peripheral portion of the third package substrate 2500.

Figure 10:
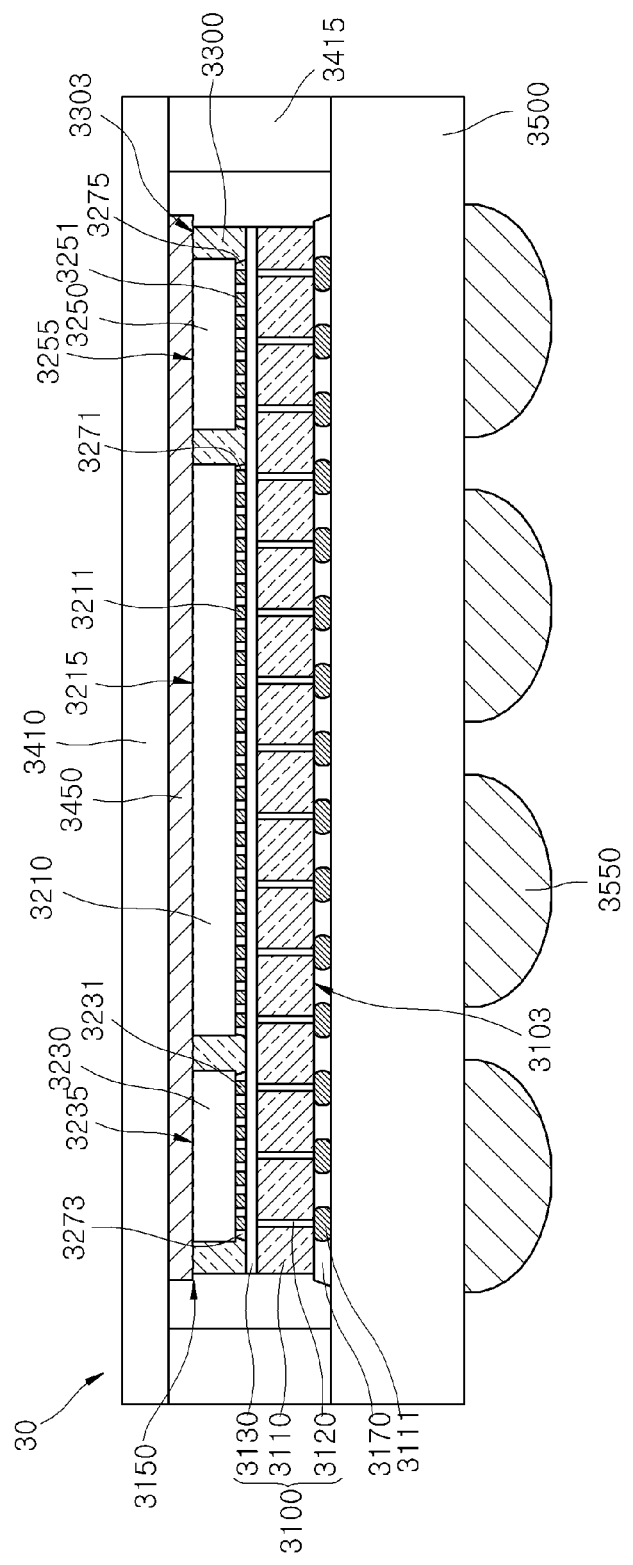
FIGS. 10 to 12 are diagrams illustrating a multi chip package according to another embodiment.
Figure 11:
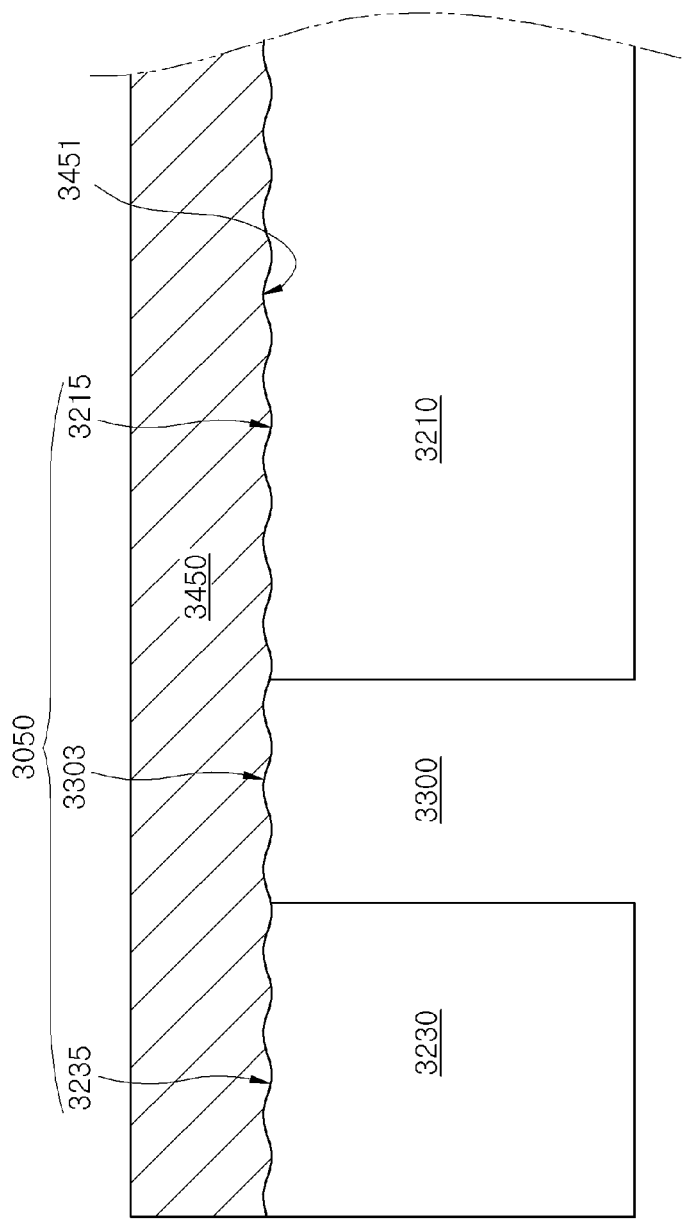
Figure 12:
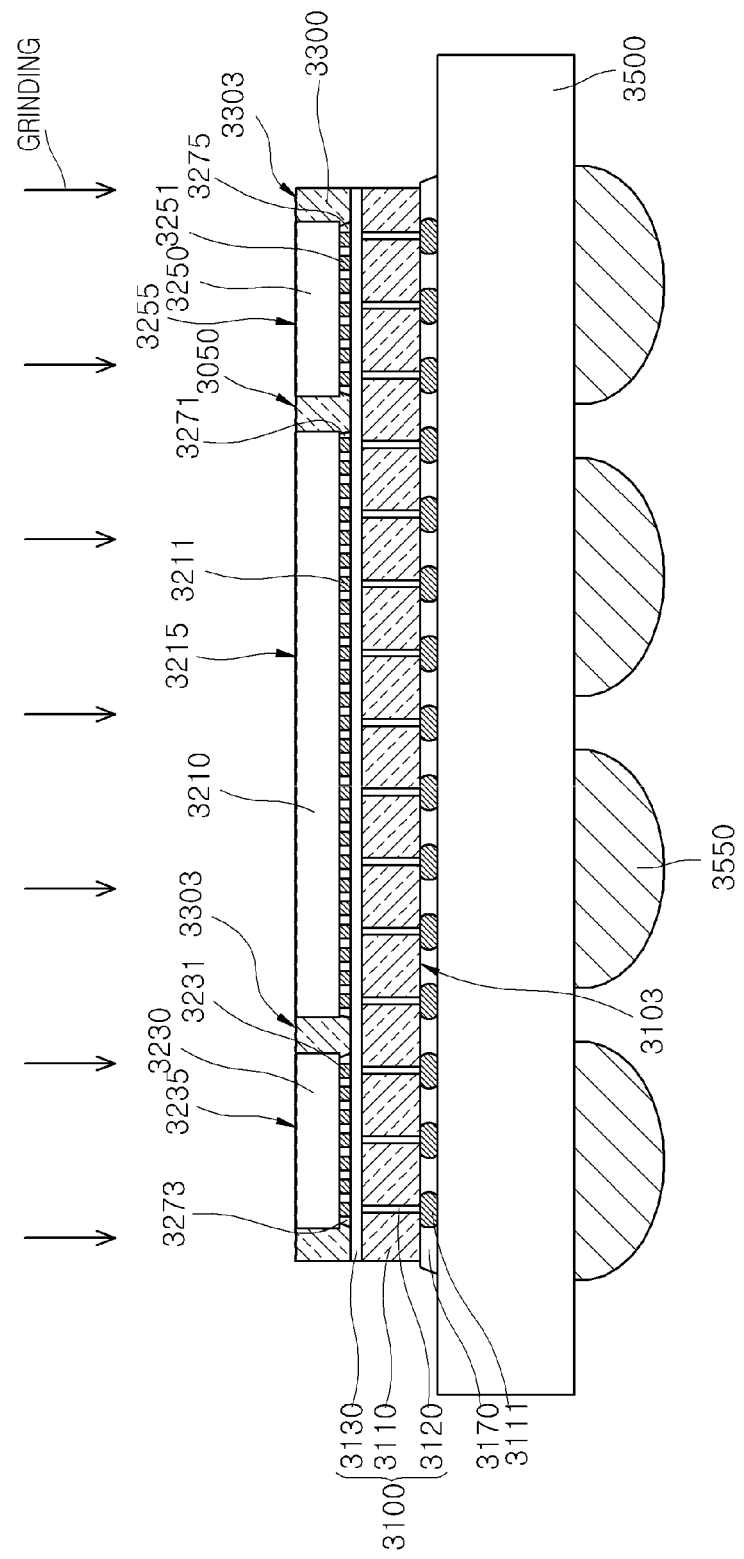

FIG. 10 is a sectional view illustrating the structure of a multi chip package 30, and FIG. 11 is an enlarged view of a rough surface 3050 of a global planar surface. FIG. 12 is a diagram illustrating a process of forming the rough surface 3050 of the global planar surface.

Referring to FIG. 10, the multi chip package 30 may include a plurality of semiconductor chips 3210, 3230, and 3250 mounted on a first package substrate 3100. The first package substrate 3100, for example, may include a first silicon substrate body 3110, first through electrodes 3120 that pass through the body 3110 to provide a vertical electrical connection, and a first dielectric layer 3130 that includes an interconnection part. First connection parts 3111 (e.g., bumps) are coupled to one end of the first through electrodes 3120. The other end of the first through electrodes 3120 may be substantially electrically connected to the semiconductor chips 3210, 3230, and 3250. The first package substrate 3100 (e.g., having an interposer structure) may be mounted on a second package substrate 3500, such as a printed circuit board (PCB). Fifth connection parts 3550 (e.g., solder balls) provide the second package substrate 3500 with an external connection.

The semiconductor chips are mounted on the first package substrate 3100, such that second connection parts 3211 of the first semiconductor chip 3210, third connection parts 3231 of the second semiconductor chip 3230, and fourth connection parts 3251 of the third semiconductor chip 3250 are electrically connected to the first through electrodes 3120.

A third dielectric layer 3271, such as an underfill, is provided between the first package substrate 3100 and the first semiconductor chip 3210, in order to isolate the second connection parts 3211 from one another. A fourth dielectric layer 3273, such as an underfill, is provided between the first package substrate 3100 and the second semiconductor chip 3230, in order to isolate the third connection parts 3231 from one another. A fifth dielectric layer 3275, such as an underfill, is provided between the first package substrate 3100 and the third semiconductor chip 3250, in order to isolate the fourth connection parts 3251 from one another.

An upper surface 3303 of a protective layer 3300, an upper surface 3215 of the first semiconductor chip 3210, an upper surface 3235 of the second semiconductor chip 3230, and an upper surface 3255 of the third semiconductor chip 3250 may form a global planar surface having a rough surface 3050 (e.g., fine convex or concave shapes). The rough surface 3050 of the global planar surface may provide a larger surface area, thereby increasing a contact area between the rough surface 3050 and a lower or bottom surface 3451 of a thermal interface material 3450 coated on the rough surface 3050. Therefore, heat transfer from the semiconductor chips 3210, 3230, and 3250 to the thermal interface material 3450 and a heat spreader 3410 attached on the thermal interface material 3450 (and supported by a stiffener 3415) may be effectively performed.

As illustrated in FIG. 12, the rough surface 3050 of the global planar surface may be obtained by removing (e.g., via a grinding process) a part of an upper side of the protective layer 3300 and a part of upper sides of the chips 3210, 3230, and 3250. For example, a removal process such as CMP or an etch-back process is performed as a preliminary process, and then a process of purposefully inducing a scratch on a polished surface is additionally performed, so that the rough surface 3050 can be obtained. The process of purposefully inducing a scratch may be performed as a grinding process of inducing a large or desired roughness.

Figure 13:
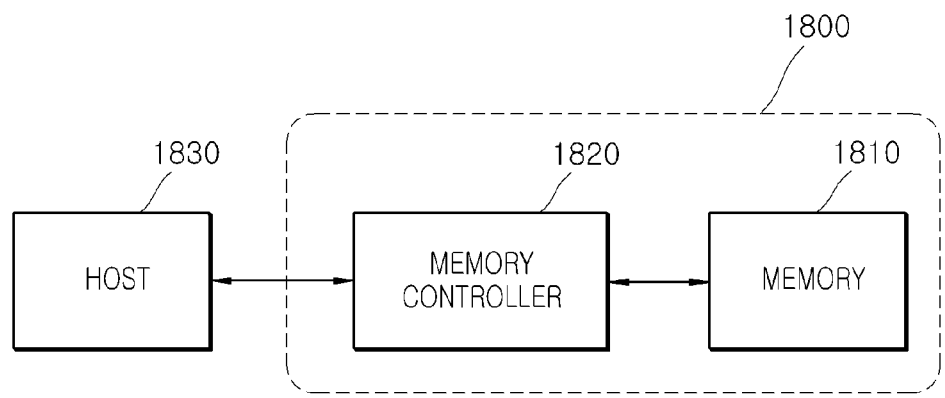
FIG. 13 is a block diagram illustrating an electronic system employing a memory card including an package in accordance with an embodiment.

FIG. 13 is a block diagram illustrating an electronic system including a memory card 1800 including at least one multi chip package according to an embodiment. The memory card 1800 includes a memory 1810, such as a nonvolatile memory device, and a memory controller 1820. The memory 1810 and the memory controller 1820 may store data or read stored data. The memory 1810 and/or the memory controller 1820 include one or more semiconductor chips disposed in an embedded package according to an embodiment.

The memory 1810 may include a nonvolatile memory device to which the technology of the embodiments of the present invention is applied. The memory controller 1820 may control the memory 1810 such that stored data is read out or data is stored in response to a read/write request from a host 1830.

Figure 14:
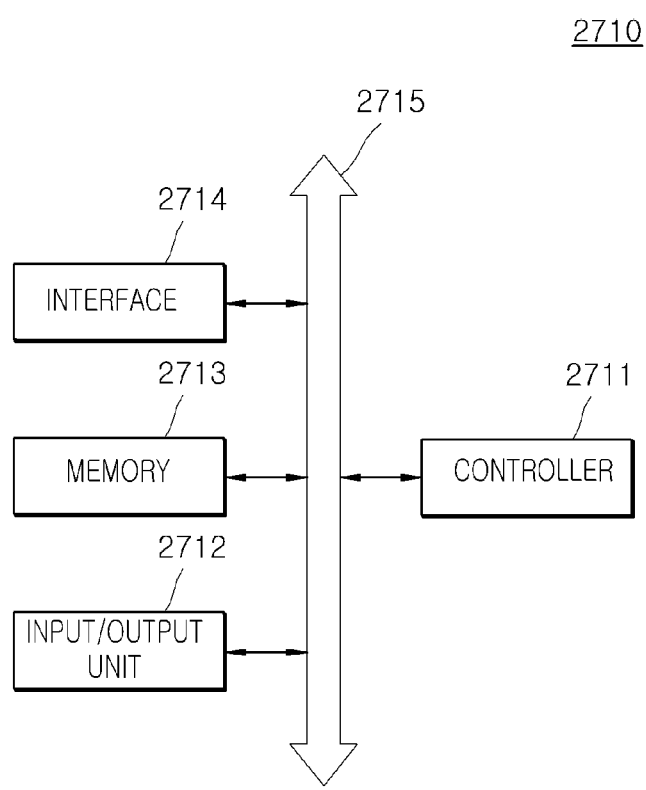
FIG. 14 is a block diagram illustrating an electronic system including a package in according to an embodiment.

FIG. 14 is a block diagram illustrating an electronic system 2710 including at least one multi chip package according to an embodiment. The electronic system 2710 may include a controller 2711, an input/output device 2712, and a memory 2713. The controller 2711, the input/output device 2712 and the memory 2713 may be coupled with one another through a bus 2715 providing a path through which data move.

In an embodiment, the controller 2711 may include one or more microprocessors, digital signal processors, microcontrollers, and/or logic devices capable of performing the same functions as these components. The controller 2711 or the memory 2713 may include one or more of the semiconductor packages according to embodiments of the present disclosure. The input/output device 2712 may include at least one selected among a keypad, a keyboard, a display device, a touchscreen and so forth. The memory 2713 is a device for storing data. The memory 2713 may store data and/or commands to be executed by the controller 2711, and the like.

The memory 2713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 2710 may stably store a large amount of data in a flash memory system.

The electronic system 2710 may further include an interface 2714 configured to transmit and receive data to and from a communication network. The interface 2714 may be a wired or wireless type. For example, the interface 2714 may include an antenna or a wired or wireless transceiver.

The electronic system 2710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 2710 is an equipment capable of performing wireless communication, the electronic system 2710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A method for manufacturing a multi chip package, the method comprising:
   mounting a first chip and a second chip over an upper surface of a first substrate;
   forming a protective layer that covers the first chip and the second chip;
   removing a part of an upper side of the protective layer and a part of upper sides of the first chip and the second chip by planarizing an upper surface of the first chip, an upper surface of the second chip, and an upper surface of the protective layer to form a global planar surface;
   grinding the global planar surface to form rough surfaces of convex and concave shapes;
   forming a thermal interface material over the upper surface of the first chip, over the upper surface of the second chip, and over the upper surface of the protective layer; and
   attaching a heat spreader to the thermal interface material,
   wherein the first substrate has an interposer structure including a first interconnection part, a second interconnection part, and a through electrode,
   wherein the first chip is positioned beside the second chip over the interposer structure,
   wherein the second interconnection part has a horizontal connection structure to connect the first chip and the second chip, and
   wherein the first interconnection part connects the first chip to the through electrode.

2. The method of claim 1, wherein a function performed by the first chip is different from a function performed by the second chip.

3. The method of claim 1, wherein the first chip includes at least two vertically stacked memory chips; and
   wherein the second chip includes a graphic processing unit (GPU), a central processing unit (CPU), or a system on chip (SoC).

4. The method of claim 1, further comprising:
   positioning a vertical stiffener between the heat spreader and the first substrate to support the heat spreader.

5. The method of claim 1, further comprising:
   mounting the first substrate on a second substrate before attaching a heat spreader to the thermal interface material; and
   positioning a vertical stiffener between the heat spreader and the second substrate to support the heat spreader.

* * * * *